(12) United States Patent
Issa et al.

(10) Patent No.: US 12,476,641 B2
(45) Date of Patent: Nov. 18, 2025

(54) CLOCK SELECTION METHOD FOR MULTIPLYING DELAY LOCKED LOOP

(71) Applicant: SAMSUNG ELECTRONICS CO., LTD., Suwon-si (KR)

(72) Inventors: Venkatasuryam Setty Issa, Bengaluru (IN); Aswani Aditya Kumar Tadinada, Bengaluru (IN); Subba Reddy Siddamurthy, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 304 days.

(21) Appl. No.: 18/136,017

(22) Filed: Apr. 18, 2023

(65) Prior Publication Data

US 2024/0022253 A1 Jan. 18, 2024

(30) Foreign Application Priority Data

Jul. 14, 2022 (IN) .............................. 202241040410

(51) Int. Cl.
*H03L 7/081* (2006.01)
*H03L 7/085* (2006.01)
*H03L 7/099* (2006.01)
*H03L 7/18* (2006.01)

(52) U.S. Cl.
CPC .............. *H03L 7/081* (2013.01); *H03L 7/085* (2013.01); *H03L 7/099* (2013.01); *H03L 7/18* (2013.01)

(58) Field of Classification Search
CPC ......... H03L 7/081; H03L 7/085; H03L 7/099; H03L 7/18
See application file for complete search history.

(56) References Cited

U.S. PATENT DOCUMENTS

| 7,593,285 B2 * | 9/2009 | Cho | .......................... | G11C 7/22 |
| | | | | 365/194 |
| 7,629,820 B2 * | 12/2009 | Heyne | ..................... | G11C 7/222 |
| | | | | 327/158 |
| 8,384,456 B1 * | 2/2013 | Ramaswamy | ........ | H03L 7/0816 |
| | | | | 327/158 |

(Continued)

FOREIGN PATENT DOCUMENTS

| CN | 104821808 B | 8/2017 |
| CN | 110212915 A | 9/2019 |

(Continued)

OTHER PUBLICATIONS

Dennis Fischetter, "First Time, Every Time—Practical Tips for Phase-Locked Loop Design", 2007, (120 pages).

(Continued)

*Primary Examiner* — Adam D Houston
(74) *Attorney, Agent, or Firm* — Sughrue Mion, PLLC

(57) ABSTRACT

There is provided a method for generating a select signal for a multiplexer of a Multiplying Delay Locked Loop (MDLL). The method includes determining that an output of a divider of the MDLL is a high level, determining that an output signal of a multiplexed voltage controlled oscillator (VCO) of the MDLL is a falling edge after the output of the divider is the high level and inserting a select signal as a select input to the multiplexer at the falling edge of the output signal of the multiplexed VCO in response to determining that the output of the divider has achieved the high level.

18 Claims, 14 Drawing Sheets

(56) References Cited

U.S. PATENT DOCUMENTS

| | | | |
|---|---|---|---|
| 8,710,881 B2 | 4/2014 | Utamaru | |
| 9,553,593 B1 * | 1/2017 | Weng | H03L 7/07 |
| 9,641,315 B2 | 5/2017 | Bogdan | |
| 10,340,902 B1 * | 7/2019 | Fortier | H03L 7/0812 |
| 11,271,574 B1 * | 3/2022 | O'Sullivan | H03L 7/099 |
| 11,405,025 B1 * | 8/2022 | Hao | H03L 7/0995 |
| 11,588,491 B2 | 2/2023 | Wei et al. | |
| 2005/0127964 A1 * | 6/2005 | Lee | H03L 7/0998 |
| | | | 327/158 |
| 2005/0141334 A1 * | 6/2005 | Jeong | G11C 29/02 |
| | | | 365/194 |
| 2005/0248377 A1 * | 11/2005 | Drexler | G11C 7/22 |
| | | | 327/158 |
| 2008/0252507 A1 * | 10/2008 | Gerfers | H03M 1/52 |
| | | | 341/155 |
| 2015/0215110 A1 * | 7/2015 | Chen | H04L 7/0041 |
| | | | 327/158 |
| 2015/0256164 A1 * | 9/2015 | Ebato | H03K 5/13 |
| | | | 327/161 |
| 2017/0366191 A1 * | 12/2017 | Wang | H03L 7/0814 |
| 2019/0280696 A1 * | 9/2019 | Wang | H03L 7/091 |
| 2020/0228122 A1 * | 7/2020 | Ravi | H03L 7/0995 |
| 2020/0321969 A1 * | 10/2020 | Janardhanan | H03L 7/093 |
| 2021/0409029 A1 | 12/2021 | Moslehi Bajestan et al. | |
| 2022/0376697 A1 * | 11/2022 | Cho | H03M 1/1245 |
| 2024/0022253 A1 * | 1/2024 | Issa | H03L 7/18 |

FOREIGN PATENT DOCUMENTS

| | | | |
|---|---|---|---|
| CN | 110518907 B | 12/2021 | |
| JP | 2017-213050 A | 12/2017 | |
| KR | 10-2008-0101495 A | 11/2008 | |
| WO | WO-2024003938 A1 * | 1/2024 | H02M 3/157 |

OTHER PUBLICATIONS

Somnath Kundu et al., "A 0.2-1.45-GHz Subsampling Fractional-N Digital MDLL With Zero-Offset Aperture PD-Based Spur Cancellation and In Situ Static Phase Offset Detection", IEEE Journal of Solid-State Circuits, vol. 52. No. 3, Mar. 2017, (13 pages).

S. Levantino et al., "A 1.7 GHZ Fractional-N Frequency Synthesizer Based on a Multiplying Delay-Locked Loop", IEEE JSSC, vol. 50, No. 11, Nov. 2015, (14 pages).

S. Kundu et al., "A Self-Calibrated 2-bit Time-Period Comparator-Based Synthesized Fractional-N MDLL in 22-nm FinFET CMOS", IEEE JSSC, vol. 56, No. 1, Jan. 2021, (13 pages).

Office Action issued on Jun. 16, 2025 by the Indian Patent Office in corresponding IN Patent Application No. 202241040410.

* cited by examiner

FIG. 5

CLOCK SELECTION METHOD FOR MULTIPLYING DELAY LOCKED LOOP

CROSS-REFERENCE TO RELATED APPLICATION

This application is based on and claims priority from Indian Patent Application No. 202241040410 filed on Jul. 14, 2022, in the Indian Intellectual Property Office, the disclosure of which is incorporated by reference herein in its entirety.

BACKGROUND

1. Field

The disclosure relates to phase locked loops (PLLs), and more specifically is related to a method of clock selection for a Multiplying Delay Locked Loop (MDLL).

2. Description of Related Art

A Multiplying Delay Locked Loop (MDLL) is a type of electronic circuit for frequency multiplication of an input clock signal. Major components of the MDLL are a multiplexed voltage controlled ring oscillator, a divider, a phase detector and a loop filter. FIG. 1 shows a plurality of electronic components of a related art phase locked loops (PLLs).

In related art architectures, the internal components of the ring oscillator are accessed for MDLL multiplexer (Mux) selection signal (SEL) generation, and are generally designed for 5-stage ring oscillator, which may not work with a 3-stage ring oscillator. Also some of the related art architectures not only need internal components of ring oscillator but also, special conditions like, differential ring oscillator with skewed rise, fall times.

Using internal phases of the ring oscillator for Mux selection limits a coarse and fine control options for the ring oscillator.

Many of the related art architectures work only at Full-Rate, wherein an edge of an output signal of the voltage controlled oscillator (VCOOUT) is replaced at a rate of a Reference Frequency (FREF) or corresponding VCOOUT edge is replaced for every reference edge, wherein the reference edge indicates a reference input signal (REF)

However, to track and correct a time offset error between frequency of VCOOUT (FVCO) and FREF due to drift in the ring oscillator frequency (MDLL loop's long term stability/lock), the SEL signal is generated at half-rate or quarter rate such that the VCOOUT edge is replaced for every alternate REF edge or once for every '4' REF edges.

Thus, there is a need to provide an efficient MDLL selection without accessing the internal components of the ring oscillator.

SUMMARY

An object of the disclosure is to provide a Multiplying Delay Locked Loop (MDLL) with a selection logic which does not access the internal components of the ring oscillator and generates SEL signal at either Full-rate or at half-rate or at quarter rate of FREF.

According to an aspect of the disclosure, there is provided a method for generating a select signal for a multiplexer of a Multiplying Delay Locked Loop (MDLL), the method including: determining that an output of a divider of the MDLL is a high level, determining that an output signal of a multiplexed voltage controlled oscillator (VCO) of the MDLL is a falling edge after the output of the divider is the high level and inserting a select signal as a select input to the multiplexer at the falling edge of the output signal of the multiplexed VCO in response to determining that the output of the divider has achieved the high level.

The select signal is generated based on the output signal of the multiplexed VCO, a reference signal and the output of the divider.

The select signal is generated using a select signal generation circuit, and wherein the select signal generation circuit includes: a plurality of D-flip flops, wherein the output signal of the multiplexed VCO and the output of the divider is input to the plurality of D-flip flops, and a plurality of logic gates.

The select signal is a high level at a second falling edge of the output signal of the multiplexed VCO when the output of the divider has achieved a rising edge.

The select signal is a high level at a third falling edge of the output signal of the multiplexed VCO when the output of the divider has achieved a rising edge.

The select signal is a low level at a first rising edge of the output signal of the multiplexed VCO, after the select signal is made a high level, when a reference signal is a high level.

The select signal is a low level at rising edge of a REF signal (600), when output signal of the multiplexed VCO has achieved first rising edge after select signal is made a high level.

The select signal as the select input to the multiplexer at the falling edge of the output signal of the multiplexed VCO includes: determining that the falling edge of the output signal of the multiplexed VCO is a second falling edge; and inserting the select signal at the second falling edge of the output signal of the multiplexed VCO.

The inserting the select signal as the select input to the multiplexer at the falling edge of the output signal of the multiplexed VCO includes: determining that the falling edge of the output signal of the multiplexed VCO is a third falling edge; and inserting the select signal at the third falling edge of the output signal of the multiplexed VCO.

The method further includes: determining that the select signal is a high level, determining that the output signal of the multiplexed VCO is a rising edge, determining that a reference signal is a high level and de-inserting the select signal as the select input to the multiplexer at the rising edge of the output signal of the multiplexed VCO and wherein the reference signal is a high level.

The de-inserting the select signal as the select input to the multiplexer at the rising edge of the output signal of the multiplexed VCO includes: determining that the rising edge of the output signal of the multiplexed VCO is a first rising edge, and de-inserting the select signal at the first rising edge of the output signal of the multiplexed VCO and the reference signal is a high level.

The de-inserting the select signal as the select input to the multiplexer at the rising edge of the output signal of the multiplexed VCO includes: determining that the rising edge of the output signal of the multiplexed VCO is a first rising edge after the select signal is a high level, determining that the reference signal is a low level at the first rising edge of the output signal of the multiplexed VCO and the reference signal has a rising edge after output signal of the multiplexed VCO first rising edge and de-inserting the select signal at the rising edge of the reference signal.

The select signal is selected as the select input to the multiplexer based on the output of the divider and output signal of the multiplexed VCO for insertion.

The select signal is selected as in as the select input to the multiplexer based on a reference signal and output signal of the multiplexed VCO for de-insertion.

According to another aspect of the disclosure, there is provided an apparatus including: a first circuit configured to determine that an output of a divider of a Multiplying Delay Locked Loop (MDLL) is a high level, a second circuit configured to determine that an output signal of a multiplexed voltage controlled oscillator (VCO) of the MDLL is a falling edge after the output of the divider is the high level and a third circuit configured to generate a select signal to be inserted as a select input to a multiplexer of the MDLL at the falling edge of the output signal of the multiplexed VCO based on a determination that the output of the divider has achieved the high level.

The select signal is generated based on the output signal of the multiplexed VCO, a reference signal and the output of the divider.

The third circuit is signal generation circuit includes: a plurality of D-flip flops, wherein the input to the plurality of D-flip flops is the output signal of the multiplexed VCO and the output of the divider; and a plurality of logic gates.

The third circuit is further configured to: determine that the falling edge of the output signal of the multiplexed VCO is a third falling edge; and generate the select signal at the third falling edge of the output signal of the multiplexed VCO.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF FIGURES

This method and system is illustrated in the accompanying drawings, throughout which like reference letters indicate corresponding parts in the various figures. The embodiments herein and exemplary in nature, and will be better understood from the following description with reference to the drawings, in which:

FIG. 5 is a schematic diagram, illustrating generation of the SEL signal, according to an embodiment of the disclosure;

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which the embodiments herein can be practiced and to further enable those skilled in the art to practice the embodiments herein. Accordingly, the examples should not be construed as limiting the scope of the disclosure herein.

Figure 1:
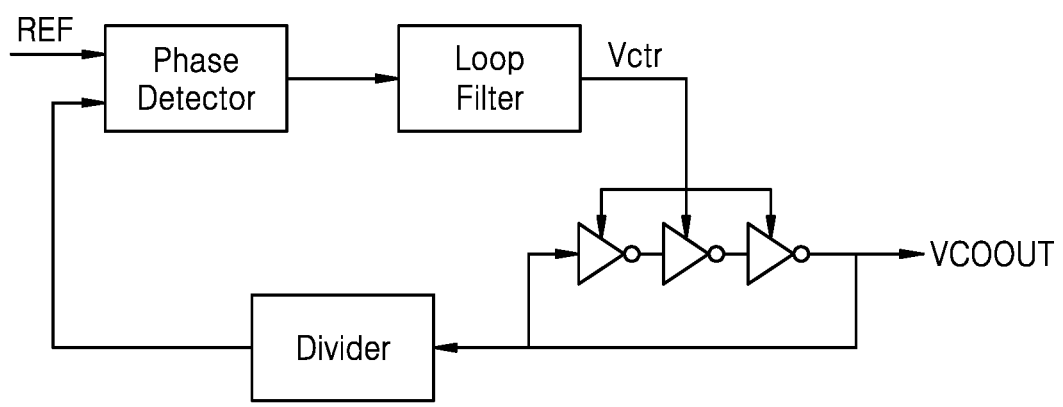
FIG. 1 is a block diagram of a Phase Locked Loop (PLL), according to related art.
Figure 2:
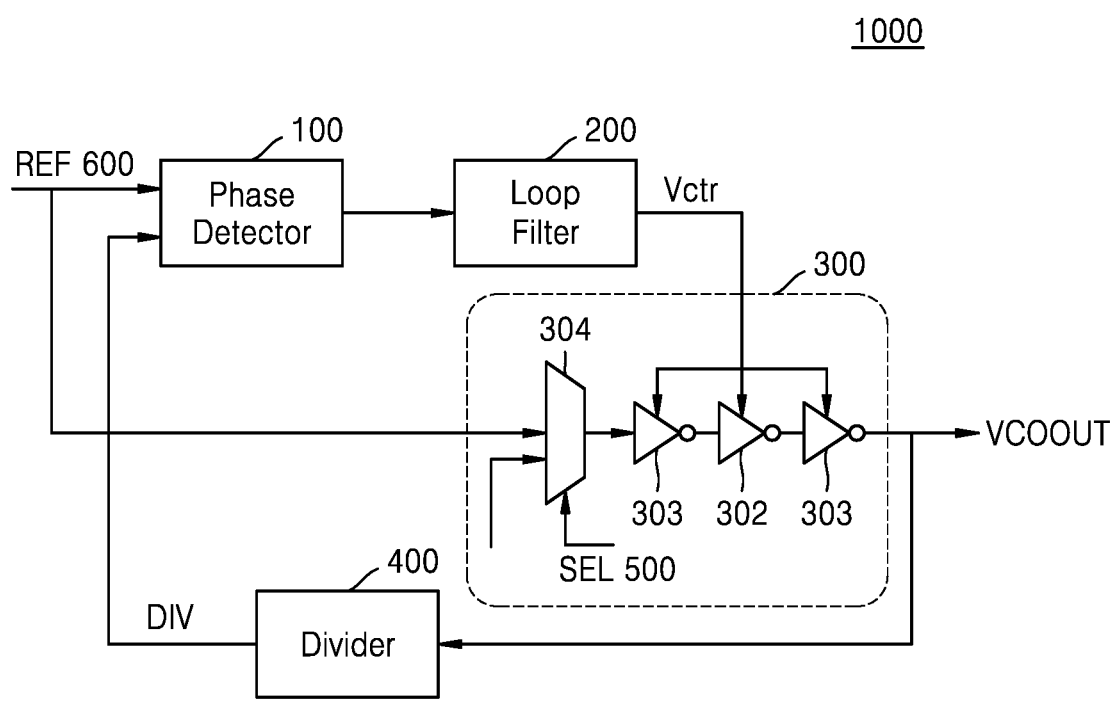
FIG. 2 is a block diagram of an MDLL, according to an embodiment.

As is traditional in the field, embodiments may be described and illustrated in terms of blocks which carry out a described function or functions (e.g., FIG. 2). These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and software. The circuits may, for example, be embodied in one or more semiconductor chips, or on substrate supports such as printed circuit boards. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

Accordingly, embodiments herein provides a MDLL selection method without accessing internal components of a ring oscillator in the MDLL. According to an embodiment, the method and the MDLL uses a SEL input to a multiplexer of multiplexed ring oscillator, wherein the SEL input is based on a divider output, the ring oscillator output and a reference signal.

According to aspect of the disclosure, there is provided a method of generating the SEL signal. Unlike a related art method, the method of SEL selection according to an embodiment of the disclosure ensures that there is no dependency on the duty cycle of the divider signal (DIV).

Referring now to the drawings, and more particularly to FIGS. 2, 3A-3D, 4A-4D, 5, 6A-6B, and 7A-7B where similar reference characters denote corresponding features consistently throughout the figures, there are shown preferred embodiments.

FIG. 2 is a block diagram of an MDLL (100), according to an embodiment of the disclosure.

In an embodiment, the MDLL (1000) includes a phase detector (100), a loop filter (200), a multiplexed voltage controlled oscillator (300), a divider (400), SEL signal (500), and a reference signal (REF) (600).

The phase detector (100) is for detecting a phase difference between an input and an output of a loop divider of the MDLL (1000). The input to the phase detector (100) is the REF signal (600) and an output (DIV) of the divider (400). An output of the phase detector (100) is provided as an input to the loop filter (200). An output (Vctr) of the loop filter is provided as an input to the multiplexed voltage controlled ring oscillator (300).

The multiplexed voltage controlled ring oscillator (300) includes a plurality of inverters (301-303) and a multiplexer (304). The output Vctr of the loop filter is provided as in input to each inverter (301-303) of the multiplexed voltage controlled ring oscillator (300).

There are multiple intermediate outputs of the multiplexed voltage controlled ring oscillator (300) from the plurality of inverters (301-304). A final output of the multiplexed voltage controlled ring oscillator (300) (VCOOUT) is an input to the multiplexer (304). Another input to the multiplexer (304) is the REF signal (600).

Accordingly, the method according to an embodiment of the disclosure ensures that there is no dependency on a DIV signal duty.

According to an embodiment, the DIV signal is loop divider output (o/p) and the duty cycle of the DIV signal varies based on divider implementation and can be as low as 1/Ndiv for a full rate operation, where Ndiv=Loop division factor.

According to an embodiment, for half rate and quarter rate operations, the divider (400) implementations give DIV signal with 50% duty cycle.

Since, the circuit has to work for all the cases, full-rate, half-rate and quarter-rate, and all types of divider implementations, it is ensured that the method for the MDLL according to an embodiment works independent of the duty cycle of the DIV signal.

Further, as the method according to an embodiment does not use any intermediate outputs from the plurality of inverters (301-303), the MDLL operates independent of the multiplexed voltage controller ring oscillator stages and type (single ended/differential).

In an embodiment, the SEL signal (500) is provided to the multiplexer (304) for selecting an input of the multiplexer (304). The output of the multiplexer (304) may be either the REF signal (600) or the final output (VCOOUT) of the voltage controlled ring oscillator (300) depending upon the SEL signal (500).

In an embodiment, the method further includes generating the SEL signal (500) based on the divider output (DIV), the REF signal (600) and the final VCOOUT.

In an embodiment, the SEL signal is inserted (a high level, 1) in the multiplexer (304) at a second falling edge of the VCOOUT, after the DIV is a high level.

In another embodiment, the SEL signal is inserted in or provided to the multiplexer (304) at a third falling edge of the VCOOUT, after the DIV is a high level.

In another embodiment, the SEL signal is de-inserted (a low level, 0) from the multiplexer (304) at first rising edge of the VCOOUT, after SEL is made A high level, when the REF signal is '1'.

In another embodiment, the SEL signal is de-inserted (a low level, 0) from the multiplexer (304) at rising edge of REF signal (600), when VCOOUT has achieved rising edge, after SEL is made a high level.

According to an embodiment, a logic circuitry for generation of the SEL signal may be implemented using an arrangement of logic gates, such as AND, OR, NOR, INV, MUX and set/reset Flip Flops.

According to an embodiment, using only the final output (VCOOUT) of voltage controlled ring oscillator (300), the output of divider (DIV) and the REF signal (600), and without internal signals of the voltage controlled ring oscillator (300), the SEL signal (logic) can achieve a maximum MDLL SEL signalhigh duration of 1/FVCO, where FVCO is the frequency of VCOOUT. Further, according to an embodiment, the method and the MDLL (1000) works for any FREF/n ('n' is an integer≥1) rate edge replacement.

Figure 3A:
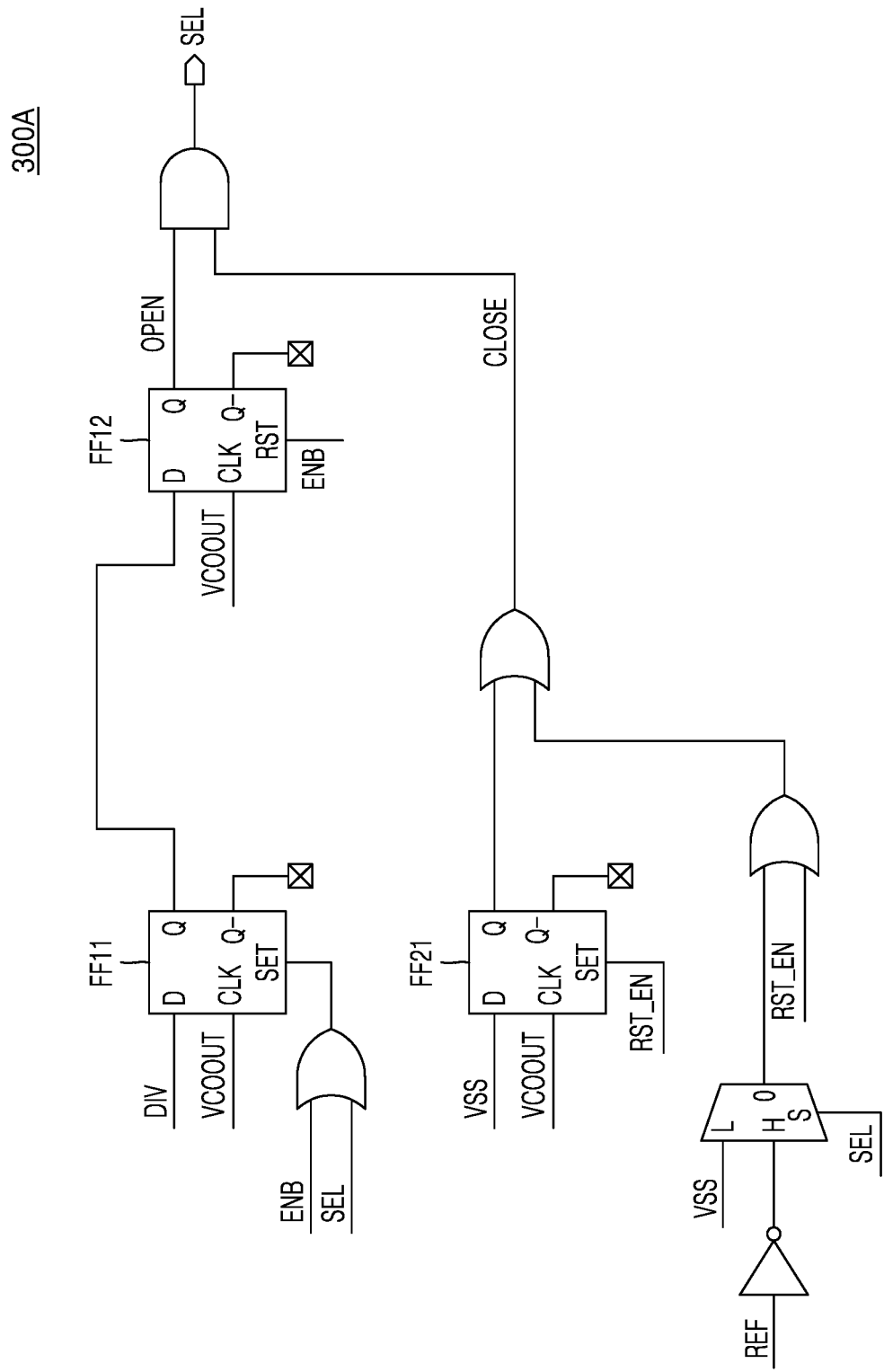
FIG. 3A is a schematic diagram, illustrating a circuit generation of the SEL signal, according to an embodiment of the disclosure.

FIG. 3A is a schematic diagram, illustrating a circuit (300A) generation of the SEL signal (500), according to an embodiment of the disclosure.

As seen in FIG. 3A, the SEL signal (500) is generated using the DIV, the REF signal (600) and the VCOOUT. The circuit (300A) comprises a plurality of flip-flops, a plurality of AND gates, a plurality of OR gates, a NOT gate and a MUX.

In an embodiment, all 'set' flops will be in 'set' state (Q=1) and 'reset' flops will be in reset state (Q=0), wherein OPEN=0, CLOSE=1 and SEL=0.

At an instance the ENB is made 0 from 1, all the flip flops except for the FF21 are out of 'set'/'reset' state such that outputs are transparent to corresponding input and the clock.

The FF21 is in 'set' state as RST_EN is still '1', and CLOSE=1.

The DIV=0 and hence at $1^{st}$ VCOOUT rising edge, an output of FF11 goes to '0'. It will go to '1', only on the $1^{st}$ rising edge of VCOOUT after DIV goes to '1'.

At the next falling edge of VCOOUT, OPEN=1 and hence SEL=1, as CLOSE is already '1'. The moment OPEN='1', RST_EN=0 and FF21 is out of 'reset' state; SEL=1 and the Mux output is transparent to Inv (REF).

The moment SEL becomes '1', FF11 goes to 'set' state and FF11 o/output=1, irrespective of DIV and OPEN. That is, SEL no longer responds to DIV and SEL become '0' only when CLOSE=0.

It is to be noted that DIV, for a minimum duty cycle case of 1/Ndiv, will have a high duration of just 1/FVCO. For instance, DIV goes to '0' before next rising edge of VCOOUT. However, SEL=1 and hence FF11 reaches 'set' state, before next VCOOUT rising edge and DIV becoming '0' within 1/FVCO time, will not affect.

When the condition of REF=1 and the rising edge of VCOOUT after SEL=1 is met: CLOSE=0 (as FF21 output (o/p)=0, Mux output=0, RST_EN=0) and hence SEL=0.

The moment SEL=0: FF11 is out of 'set' state i.e. OPEN is again transparent to DIV and VCOOUT; output of Mux in CLOSE path is '0' irrespective of REF.

OPEN goes to '0' on $2^{nd}$ falling edge of VCOOUT after both SEL and DIV are '0'. Till then, OPEN=1 and so RST_EN=0 and CLOSE=0 and so SEL will remain '0'.

After OPEN goes to '0', RST_EN=1 and hence CLOSE=1.

In another embodiment, the SEL (500) is generated using the components as listed above. In another embodiment, the SEL signal may be generated using other electronic components, however the logic remains the same.

The circuit in FIG. 3A ensures that the SEL signal (500) is inserted in the multiplexer (304) at $2^{nd}$ falling edge of the VCOOUT signal after the DIV signal has achieved a high level. The high level and the low level in the current specification indicates a binary numeral "1" and "0" respectively.

Figure 3B:
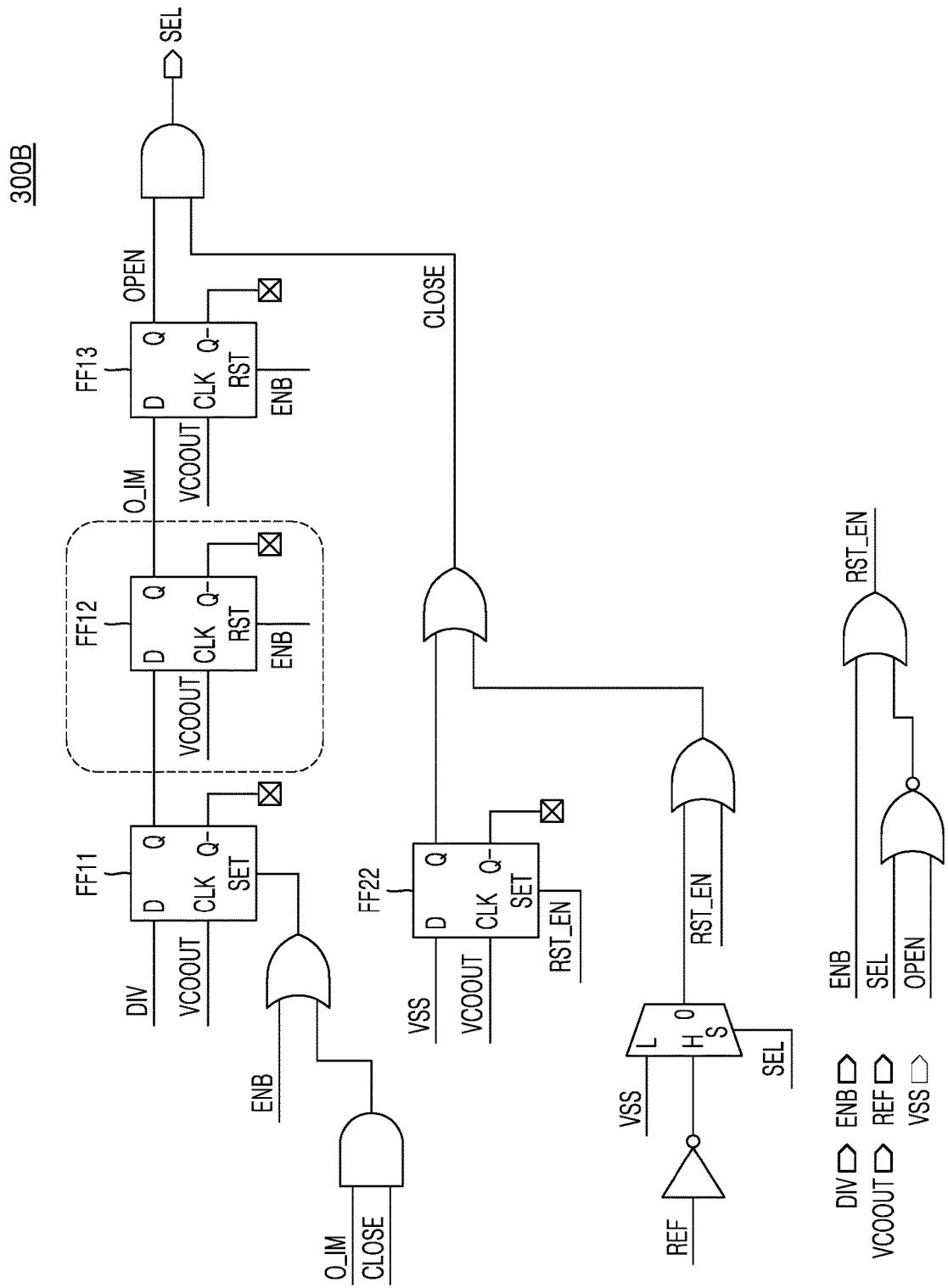
FIG. 3B is a schematic diagram, illustrating a circuit for generation of the SEL signal at a third falling edge of the VCOOUT, according to an embodiment of the disclosure.

FIG. 3B is a schematic diagram, illustrating a circuit (300B) for generation of the SEL signal (500) at a third falling edge of the VCOOUT, according to an embodiment of the disclosure.

As seen in FIG. 3B, the SEL signal (500) is generated using the DIV, the REF signal (600) and the VCOOUT. The circuit (300B) comprises a plurality of flip-flops, a plurality of AND gates, a plurality of OR gates, a NOT gate and a MUX.

In FIG. 3B, additional flip-flop is added which is clocked by falling edge of VCOOUT, in the OPEN path, to add one more falling edge to achieve OPEN and hence the SEL signal (500) insertion is on 3r d falling edge instead of $2^{nd}$ falling edge of VCOOUT as seen in FIG. 3A.

As seen in FIG. 3B, a 'set' of FF11 is generated from AND(CLOSE, O_IM) instead of the SEL signal (500), in FIG. 3A. Timing of rising edge of O_IM in FIG. 3B is aligned with timing of rising edge of OPEN in FIG. 3A: both become '1' at the same VCOOUT falling edge after DIV=1. So AND (CLOSE, O_IM) in FIG. 3B will have same timing as SEL=AND(CLOSE, OPEN) of FIG. 3A for both rising and falling edges. Hence 'set' of FF11 will have same timing for both FIG. 3A and FIG. 3B.

Figure 3C:
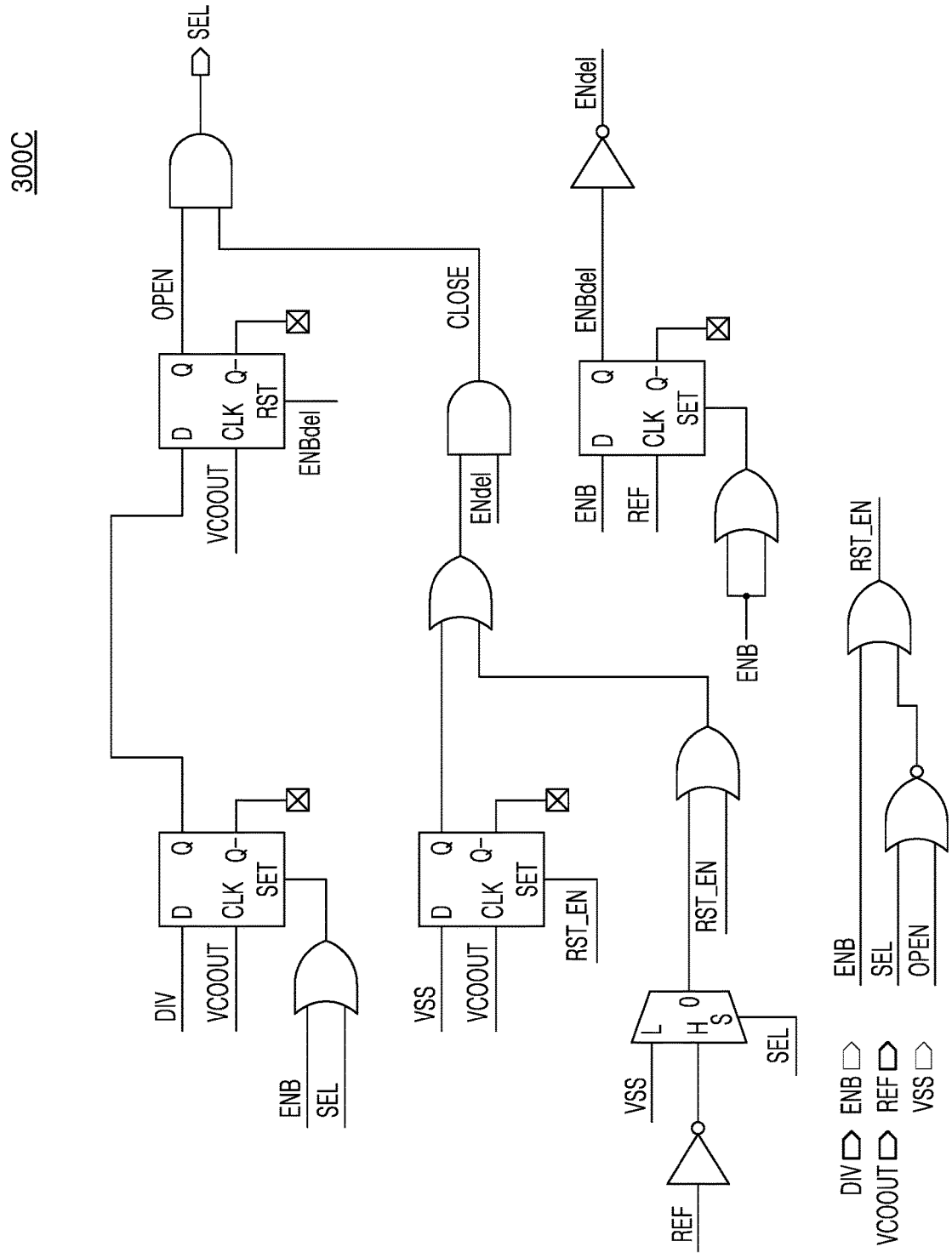
FIG. 3C is a schematic diagram, illustrating a circuit for generation of the SEL signal at a second falling edge of the VCOOUT, according to an embodiment of the disclosure.

FIG. 3C is a schematic diagram, illustrating a circuit (300C) for generation of the SEL signal (500) at a second falling edge of the VCOOUT, according to an embodiment of the disclosure.

As seen in FIG. 3C, the SEL signal (500) is generated using the DIV, the REF signal (600) and the VCOOUT. The circuit (300C) comprises a plurality of flip-flops, a plurality of AND gates, a plurality of OR gates, a NOT gate and a MUX.

According to an embodiment, the operation of FIG. 3C is same as that of FIG. 3A, but an additional flip-flop on ENB with CLK=REF and an AND gate is added.

Figure 3D:
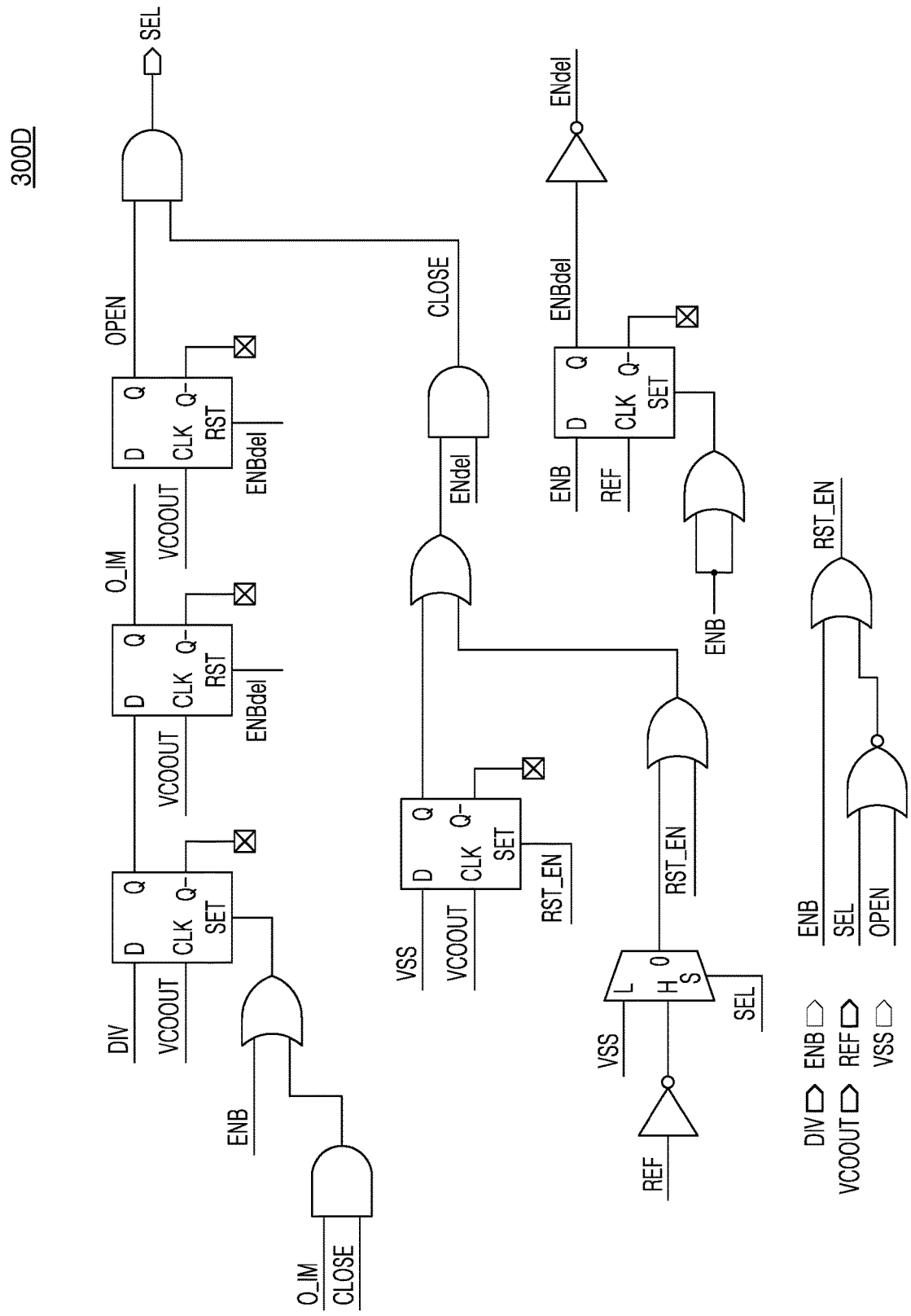
FIG. 3D is a schematic diagram, illustrating a circuit for generation of the SEL signal at a third falling edge of the VCOOUT, according to an embodiment as disclosed herein.

FIG. 3D is a schematic diagram, illustrating a circuit (300D) for generation of the SEL signal (500) at a third falling edge of the VCOOUT, according to an embodiment of the disclosure.

As seen in FIG. 3D, the SEL signal (500) is generated using the DIV, the REF signal (600) and the VCOOUT. The circuit (300D) comprises a plurality of flip-flops, a plurality of AND gates, a plurality of OR gates, a NOT gate and a MUX.

According to an embodiment, the operation of FIG. 3D is same as that of FIG. 3B, but an additional flip-flop on ENB with CLK=REF and an AND gate is added.

It is to be noted that in FIG. 3D, a start of the SEL generation block is delayed till falling edge of REF after ENB=0, to ensure the SEL generation block always start from a correct known state and hence works for all conditions.

Figure 4A:
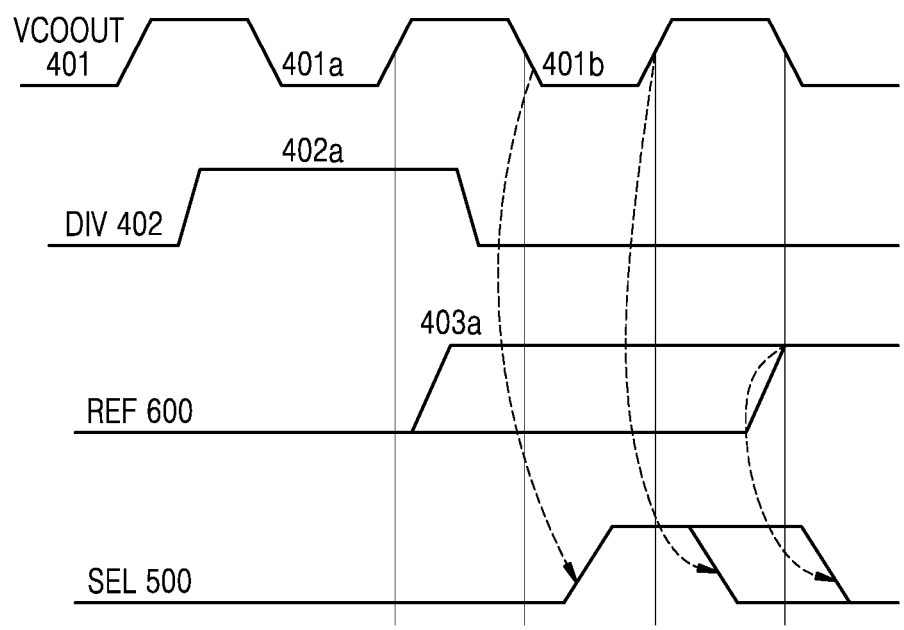
FIG. 4A is a waveform diagram, illustrating generation of the SEL signal at a second falling edge of a VCOOUT, according to an embodiment of the disclosure.

FIG. 4A is a waveform diagram, illustrating generation of the SEL signal at a second falling edge of a VCOOUT, according to an embodiment of the disclosure;

As seen in FIG. 4A, a first waveform (401) is of the final output VCOOUT of the multiplexed voltage controlled oscillator (300) with rising and falling edges. The first waveform includes a first falling edge (401a) and a second falling edge (401b) of VCOOUT after the DIV signal is a high level. A second waveform (402) is the DIV signal, which achieves a high level at (402a). A third waveform of reference signal REF signal (600) achieves a high level at (403a). A fourth waveform is of select signal SEL (500), which is generated using the circuit shown in FIG. 3A and based on the inputs, VCOOUT (401), the DIV signal (402) and the REF signal (600).

The SEL signal (500) in FIG. 4A is a high level at the second falling edge (401b) of the VCOOUT (401), where the DIV signal has already achieved a high level.

Figure 4B:
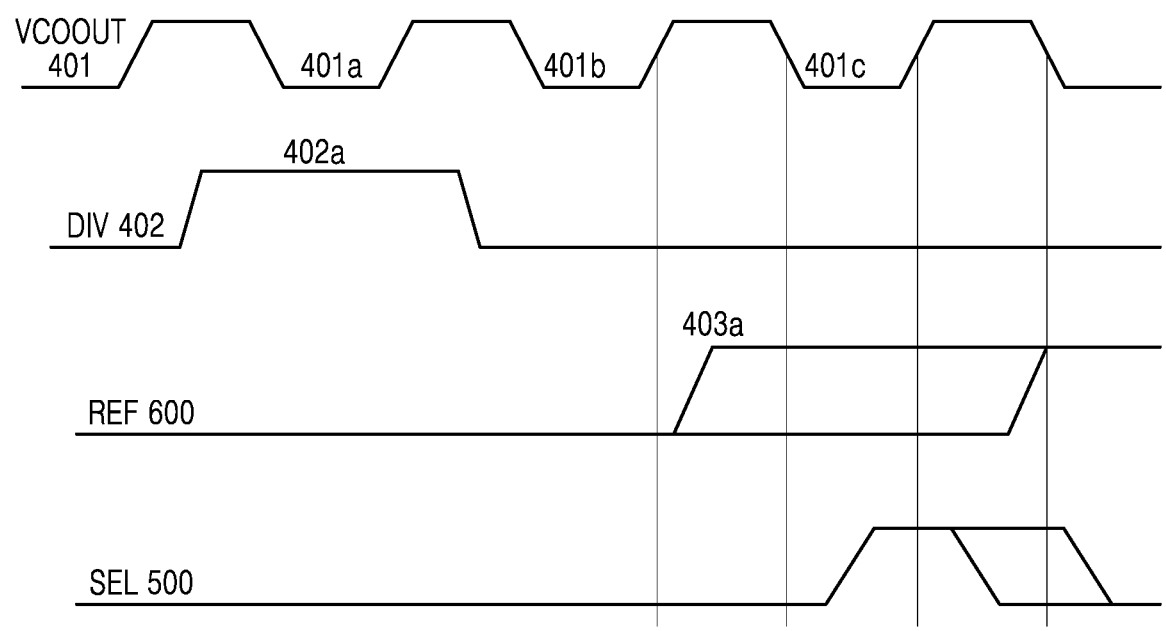
FIG. 4B is a waveform diagram, illustrating generation of the SEL signal at a third falling edge of a VCOOUT, according to an embodiment of the disclosure.

FIG. 4B is a waveform diagram, illustrating generation of the SEL signal at a third falling edge of a VCOOUT, after DIV=1, according to an embodiment of the disclosure.

As seen in FIG. 4B, a first waveform (401) is of the final output VCOOUT of the multiplexed voltage controlled oscillator (300) with rising and falling edges. The first waveform 401 includes a first falling edge (401a), a second falling edge (401b) and a third falling edge (401c) after DIV signal is a high level. A second waveform (402) is the DIV signal, which achieves a high level at (402a). A third waveform of reference signal REF signal (600) achieves a high level at (403a). A fourth waveform is of select signal SEL (500), which is the SEL signal generated using the circuit shown in FIG. 3C and based on the inputs (401), the DIV signal (402) and the REF signal (600).

The SEL signal (500) in FIG. 4B is a high level at the third falling edge (401c) of the VCOOUT (401), where the DIV signal has already achieved a high level.

Figure 4C:
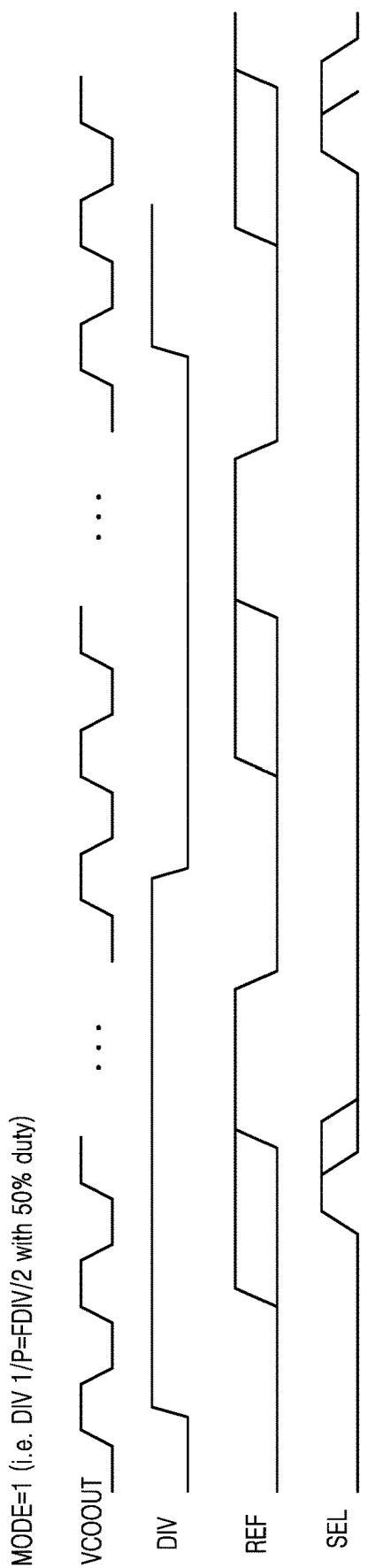
FIG. 4C is a waveform diagram, illustrating generation of the SEL signal for a half rate mode, according to an embodiment of the disclosure.

FIG. 4C is a waveform diagram, illustrating generation of the SEL signal for a half rate mode, according to an embodiment of the disclosure. For the half-rate mode, an edge replacement is done once for every '2' REF edges. In line with this, SEL signal is generated for every alternate REF edge.

Figure 5:
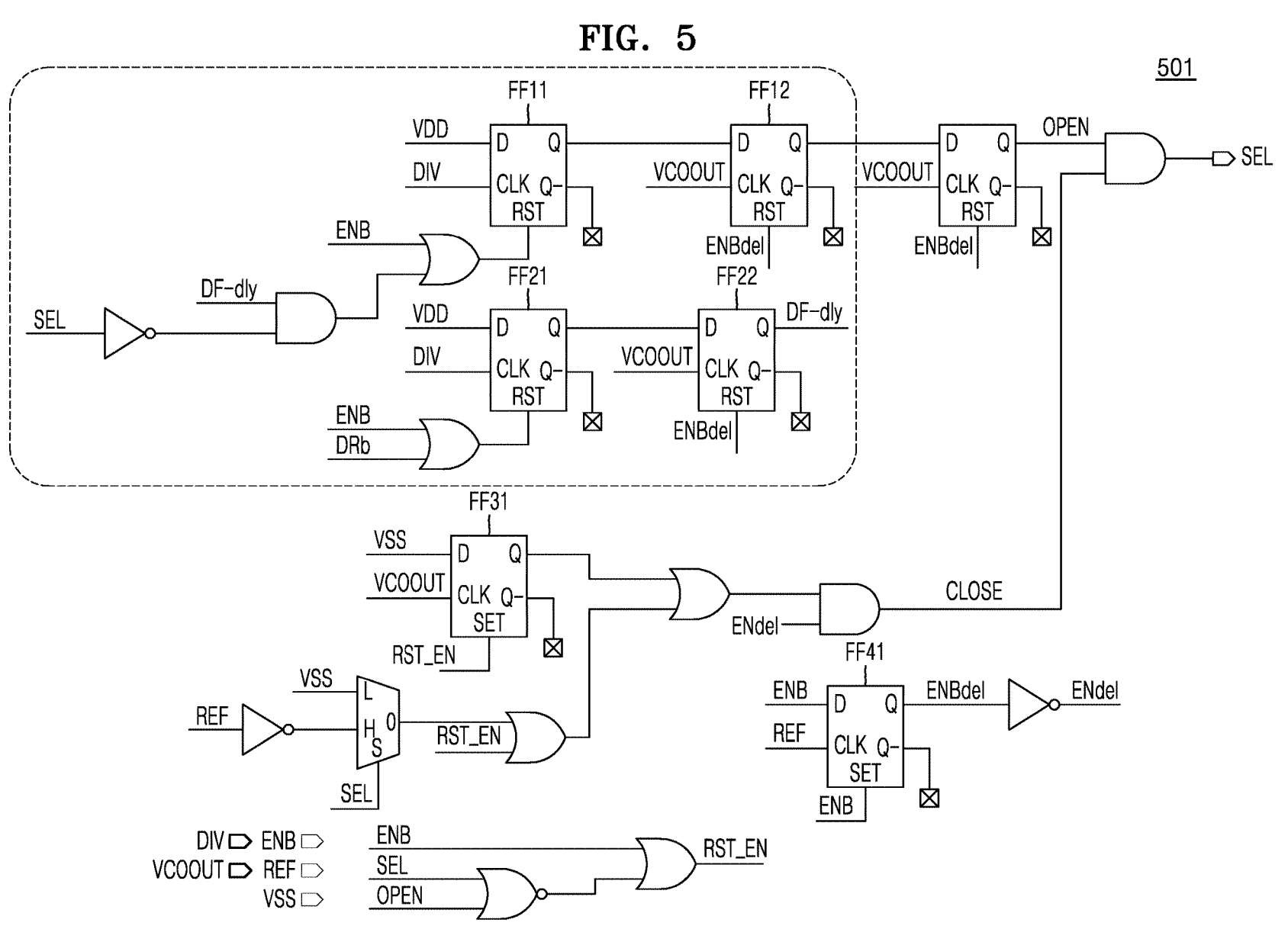

FIG. 5 is another schematic diagram, illustrating a circuit (501) for generating the SEL signal (500), according to an embodiment of the disclosure.

As seen in FIG. 5, the SEL signal (500) is generated using the DIV signal, the REF signal (600) and the VCOOUT. The circuit (500) includes a plurality of flip-flops, a plurality of AND gates, a plurality of OR gates, a plurality of NOT gate and a MUX.

The SEL (500) is generated using the components as listed above. In another embodiment, the SEL signal (500) may be generated using other electronic components, however the logic remains the same.

The circuit in FIG. 5 ensures that the SEL signal (500) can be inserted in the multiplexer (304) at $2^{nd}$ falling edge of the VCOOUT signal after the DIV signal has achieved a high level. The high level and the low level in the current specification indicates a binary numeral "1" and "0" respectively.

Further, the circuit in FIG. 5 also ensures that the SEL signal (500) may be de-inserted from the multiplexer (304) at $1^{st}$ rising edge of the VCOOUT signal after the SEL signal is made a high level and the REF signal (600) is a high level.

The high level and the low level in the current specification indicates a binary numeral "1" and "0" respectively.

In an embodiment, when the ENB=1, all 'set' flops will be in 'set' state (Q=1) and 'reset' flops will be in reset state (Q=0) and OPEN=0, CLOSE=1 and SEL=0. At the instance block enabled i.e. ENB=140, FF41 is out of 'set' state and FF41 will be transparent to ENB. After 1$^{st}$ falling edge of REF: all flops in OPEN path (FF11 to FF13) and FF22 will be out of 'set'/'reset' state such that the outputs are transparent to corresponding input and clock.

FF21 will still be in 'reset' state and DF of FF21 and DF_dly and FF22 will continue to be at '0'. FF31 will still be in 'set' state as RST_EN is still '1' and CLOSE=1.

On 1$^{st}$ rising edge of DIV, FF11, Dr=1 and FF21 will be out of 'reset' state. At the next 2$^{nd}$ falling edge of VCOOUT, after DIV rising edge, OPEN=1 and hence SEL=1, as CLOSE is already '1'.

The moment OPEN='1', RST_EN=0 and FF31 is out of 'reset' state; SEL=1 and the Mux output is transparent to Inv(REF). Moreover, FF11 input is VDD and FF11 output can go to '0', only when it is 'reset'. Also, FF11 output=1, irrespective of DIV, until it is 'reset', OPEN no longer responds to DIV and SEL can/will become '0' only when CLOSE=0. When the condition of REF=1 and a rising edge of VCOOUT after SEL=1 is met: CLOSE=0 (as FF31 output=0, Mux output=0, RST_EN=0) and hence SEL=0.

When the condition of SEL=0 and a rising edge of VCOOUT after a falling edge of DIV is met: Inv(SEL)=1 and Df_dly=1, and FF11 is 'reset'. Here, SEL goes from 0 to 1, on 2$^{nd}$ falling edge and 2$^{nd}$ rising edge of VCOOUT. DIV, for the minimum duty cycle case of 1/Ndiv, goes to '0' b/w 1$^{st}$ rising edge and 1$^{st}$ falling edge of VCOOUT; To ensure that, FF11 is not reset till SEL=1, Df_dly should become '1', only after, 1 rising edge of VCOOUT after DIV falling edge. This is achieved with FF21 and FF22.

Once FF11 is reset: OPEN goes to '0' on 2$^{nd}$ falling edge of VCOOUT. Till then, OPEN=1 and so RST_EN=0 and CLOSE=0 and so SEL will remain '0'.

Once FF11 is reset: Drb=1 and FF21 is reset. After one rising edge of VCOOUT, Df_dly=0 and FF11 is out of 'reset'. For instance, OPEN is again transparent to DIV and VCOOUT. After OPEN goes to '0', RST_EN=1 and hence CLOSE=1.

Figure 6A:
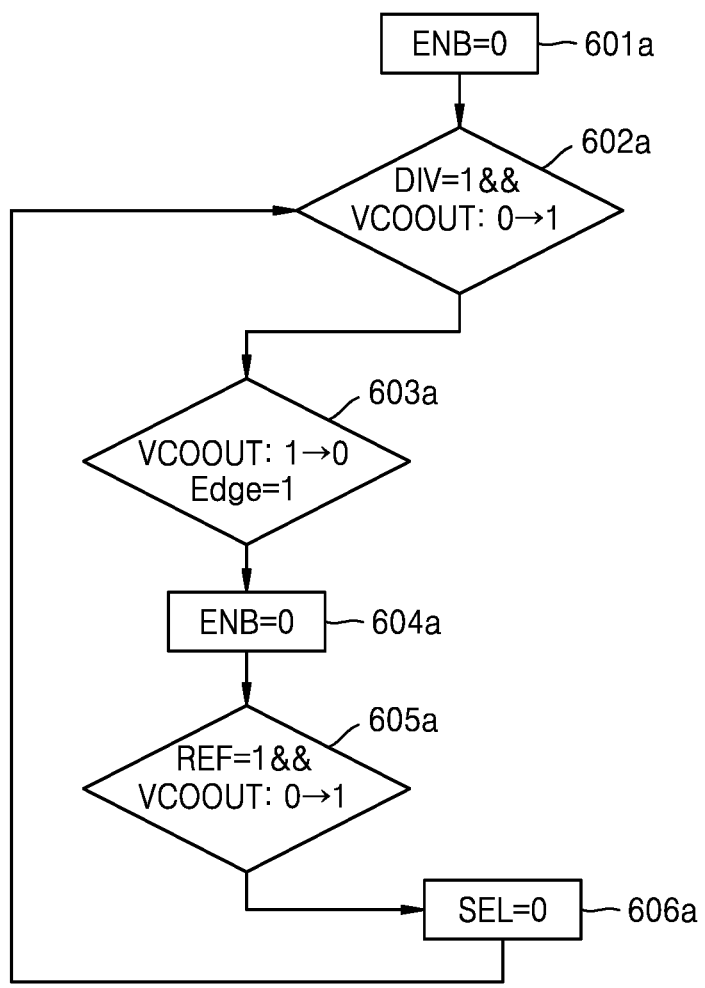
FIGS. 6A and 6B are flow diagram for generation of the SEL signal, according to an embodiment of the disclosure.

FIG. 6A is a flow diagram for generation of the SEL signal, according to an embodiment in FIG. 3C of the disclosure.

As seen in FIG. 6A, at operation (601a), the flow determines that a signal ENB is 0. The ENB is a logical inversion of EN, which the enable signal for the block. According to an embodiment, the block is enabled when EN=1 or ENB=0.

Further, at operation (602a), the method includes determining that the DIV signal is a high level and the VCOOUT signal is rising from 0-1 (i.e., from a low level to a high level). At operation (603a), the method includes determining that the VCOOUT is at a falling edge after the rising edge at (602a) and the edge of the VCOOUT is the first falling edge. At operation (604a), after satisfying the conditions from (601a-603a), SEL signal is set a high level. Further, at operation (605a), the VCOOUT is again rising from 0-1, which is the first rising edge after the SEL is a high level, and the REF signal (600) is 1. Then at operation (606a), the SEL signal is set a low level due to the rising edge of the VCOOUT and REF is '1'.

Figure 6B:
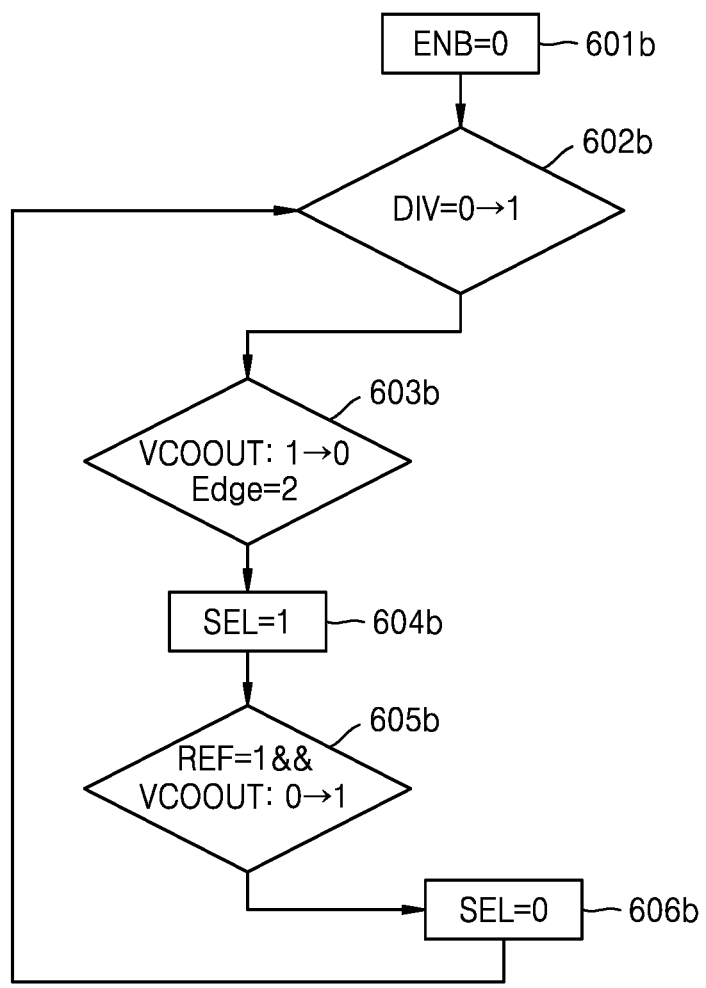

FIG. 6B is a flow diagram for generation of the SEL signal, according to an embodiment in FIG. 5 of the disclosure.

As seen in FIG. 6B, at operation (601b), the flow determines that a signal ENB is 0. Further, at operation (602b), the method includes determining that the DIV signal is becoming a high level from a low level (i.e., from 0 to 1). At operation (603b), the method includes determining that the VCOOUT is at a falling edge after the DIV rising edge at operation (602b) and the edge of the VCOOUT is the second falling edge. At operation (604b), after satisfying the conditions from operations (601b-603b), SEL signal is set a high level. Further, at operation (605b), the VCOOUT is again rising from 0-1, which is the first rising edge after SEL is a high level, and the REF signal (600) is 1. Then, at operation (606b), the SEL signal is set a low level due to the rising edge of the VCOOUT.

Figure 7A:
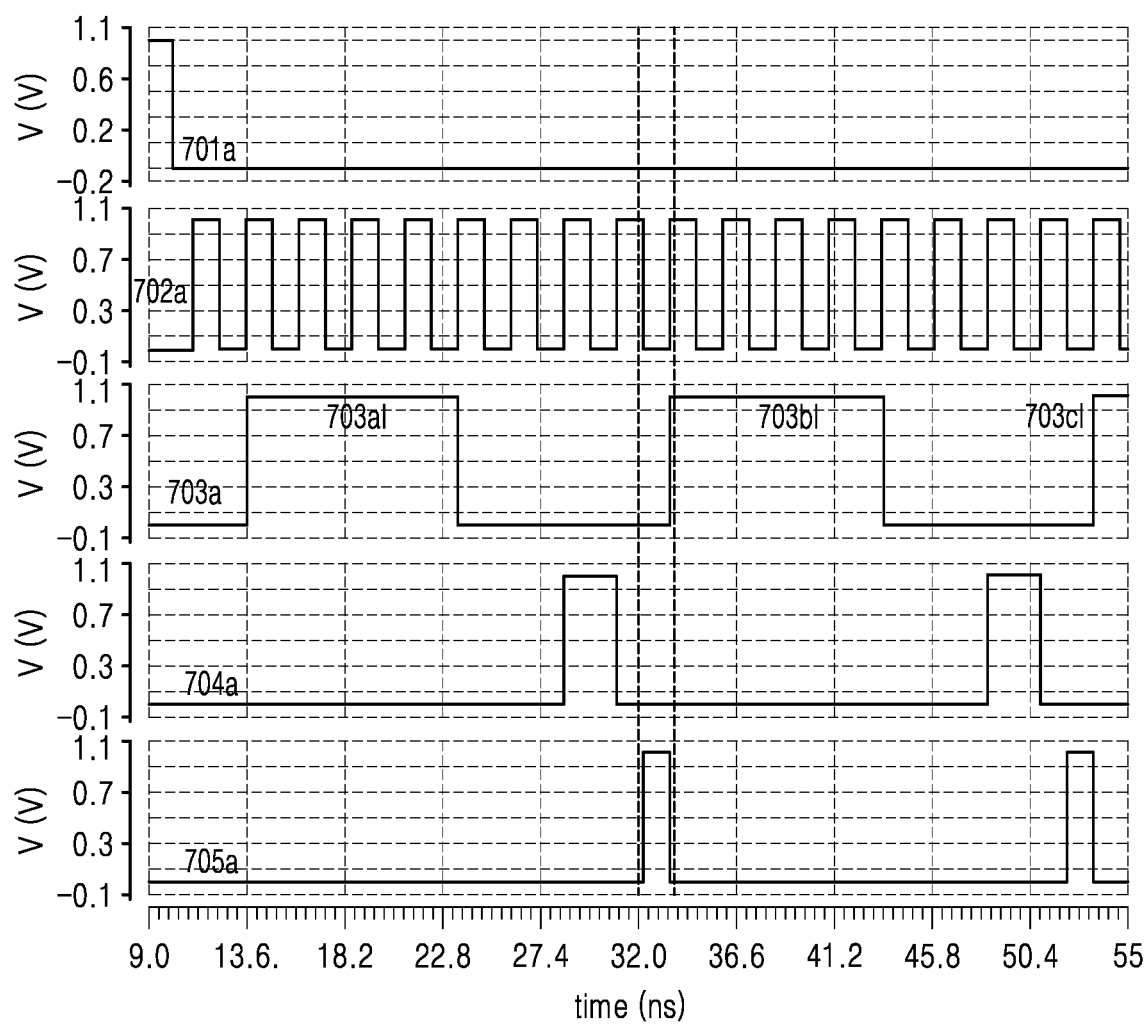
FIGS. 7A and 7B are simulation waveforms for the proposed MDLL selection signal generation, according to an embodiment of the disclosure.
Figure 7B:
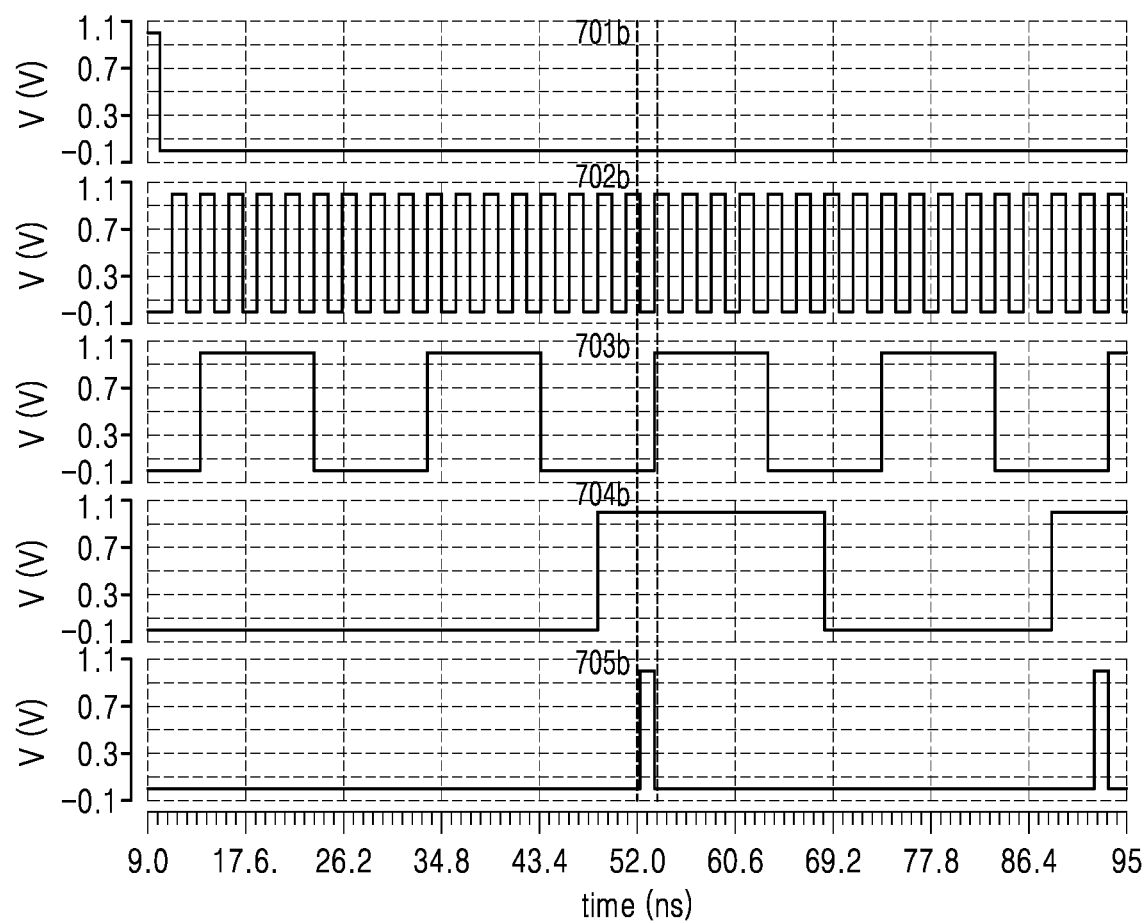

FIGS. 7A and 7B are simulation waveforms for the MDLL selection, according to an embodiment of the disclosure.

As seen in FIG. 7A, a first waveform (701a) is of a signal ENB.

A second waveform (702a) is of the final output VCOOUT of the multiplexed voltage controlled oscillator (300) with rising and falling edges. A third waveform (703) is the REF signal, which achieves a high level at (703a1, 703b1 and 703c1). A fourth waveform (704a) is the DIV signal and a fifth waveform (705a) is the SEL signal generated using the circuit shown in FIGS. 3A-3D and FIG. 5 and based on the inputs (701a), (702a), (703a) and (704a).

The SEL signal (705a) in FIG. 7A is a high level at the falling edge of the VCOOUT (702a), where the DIV (704a) signal has already achieved a high level for a full rate operation As seen in FIGS. 7B, a first waveform (701b) is of a signal ENB.

A second waveform (702b) is of the final output VCOOUT of the multiplexed voltage controlled oscillator (300) with rising and falling edges. A third waveform (703b) is the REF signal. A fourth waveform (704b) is the DIV signal and a fifth waveform (705b) is the SEL signal generated using the circuit shown in FIGS. 3A-3D and FIG. 5 and based on the inputs (701b), (702b), (703b) and (704b).

The SEL signal (705b) in FIG. 7B is a high level at the falling edge of the VCOOUT (702b), where the DIV (704b) signal has already achieved a high level for a half rate operation.

The embodiments disclosed herein can be implemented using at least one software program running on at least one hardware device and performing network management functions to control the elements.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of example embodiments, those skilled in the art will recognize that the embodiments herein can be practiced with modification within the spirit and scope of the disclosure as described herein.

What is claimed:

1. A method for generating a select signal for a multiplexer of a Multiplying Delay Locked Loop (MDLL), the method comprising:

determining that an output of a divider of the MDLL is a high level;
determining that an output signal of a multiplexed voltage controlled oscillator (VCO) of the MDLL is a falling edge after the output of the divider is the high level; and
inserting a select signal with the high level as a select input to the multiplexer at the falling edge of the output signal of the multiplexed VCO based on the output of the divider having the high level.

2. The method as claimed in claim 1, wherein the select signal is generated based on the output signal of the multiplexed VCO, a reference signal and the output of the divider.

3. The method as claimed in claim 1, wherein the select signal is generated using a select signal generation circuit, and wherein the select signal generation circuit comprises:
a plurality of D-flip flops, wherein the output signal of the multiplexed VCO and the output of the divider is input to the plurality of D-flip flops; and
a plurality of logic gates.

4. The method as claimed in claim 1, wherein the select signal is the high level at a second falling edge of the output signal of the multiplexed VCO when the output of the divider has achieved a rising edge.

5. The method as claimed in claim 1, wherein the select signal is the high level at a third falling edge of the output signal of the multiplexed VCO when the output of the divider has achieved a rising edge.

6. The method as claimed in claim 1, wherein the select signal is a low level at a first rising edge of the output signal of the multiplexed VCO, after the select signal is made the high level, when a reference signal is the high level.

7. The method as claimed in claim 1, wherein the select signal is a low level at a rising edge of a reference signal, when output signal of the multiplexed VCO has achieved a first rising edge after the select signal is made the high level.

8. The method as claimed in claim 1, wherein the inserting the select signal as the select input to the multiplexer at the falling edge of the output signal of the multiplexed VCO comprises:
determining that the falling edge of the output signal of the multiplexed VCO is a second falling edge; and
inserting the select signal at the second falling edge of the output signal of the multiplexed VCO.

9. The method as claimed in claim 1, wherein the inserting the select signal as the select input to the multiplexer at the falling edge of the output signal of the multiplexed VCO comprises:
determining that the falling edge of the output signal of the multiplexed VCO is a third falling edge; and
inserting the select signal at the third falling edge of the output signal of the multiplexed VCO.

10. The method as claimed in claim 9, wherein the method further comprises:
determining that the select signal is the high level;
determining that the output signal of the multiplexed VCO is a rising edge;
determining that a reference signal is the high level; and
de-inserting the select signal as the select input to the multiplexer at the rising edge of the output signal of the multiplexed VCO and wherein the reference signal is the high level.

11. The method as claimed in claim 10 wherein the de-inserting the select signal as the select input to the multiplexer at the rising edge of the output signal of the multiplexed VCO comprises:
determining that the rising edge of the output signal of the multiplexed VCO is a first rising edge; and
de-inserting the select signal at the first rising edge of the output signal of the multiplexed VCO and the reference signal is the high level.

12. The method as claimed in claim 11, wherein the de-inserting the select signal as the select input to the multiplexer at the rising edge of the output signal of the multiplexed VCO comprises:
determining that the rising edge of the output signal of the multiplexed VCO is a first rising edge after the select signal is the high level;
determining that the reference signal is a low level at the first rising edge of the output signal of the multiplexed VCO and the reference signal has a rising edge after the first rising edge of the output signal of the multiplexed VCO; and
de-inserting the select signal at the rising edge of the reference signal.

13. The method as claimed in claim 1, wherein the select signal is selected as the select input to the multiplexer based on the output of the divider and output signal of the multiplexed VCO for insertion.

14. The method as claimed in claim 1, wherein the select signal is selected as in as the select input to the multiplexer based on a reference signal and output signal of the multiplexed VCO for de-insertion.

15. An apparatus comprising:
a first circuit configured to determine that an output of a divider of a Multiplying Delay Locked Loop (MDLL) is a high level;
a second circuit configured to determine that an output signal of a multiplexed voltage controlled oscillator (VCO) of the MDLL is a falling edge after the output of the divider is the high level; and
a third circuit configured to generate a select signal with the high level to be inserted as a select input to a multiplexer of the MDLL at the falling edge of the output signal of the multiplexed VCO based on a determination that the output of the divider has the high level.

16. The apparatus of claim 15, wherein the select signal is generated based on the output signal of the multiplexed VCO, a reference signal and the output of the divider.

17. The apparatus of claim 15, wherein the third circuit is signal generation circuit comprising:
a plurality of D-flip flops, wherein the input to the plurality of D-flip flops is the output signal of the multiplexed VCO and the output of the divider; and
a plurality of logic gates.

18. The apparatus of claim 15, wherein the third circuit is further configured to:
determine that the falling edge of the output signal of the multiplexed VCO is a third falling edge; and
generate the select signal at the third falling edge of the output signal of the multiplexed VCO.

* * * * *